(12) United States Patent
Tseng

(10) Patent No.: US 7,119,589 B2
(45) Date of Patent: Oct. 10, 2006

(54) JITTER-RESISTIVE DELAY LOCK LOOP CIRCUIT FOR LOCKING DELAYED CLOCK AND METHOD THEREOF

(75) Inventor: Jui-Hsing Tseng, Kaoshiung (TW)

(73) Assignee: Mediatek Incorporation, Hsin-Chu Hsien (TW)

( * ) Notice: Subject to any disclaimer, the term of this patent is extended or adjusted under 35 U.S.C. 154(b) by 43 days.

(21) Appl. No.: 10/711,313

(22) Filed: Sep. 10, 2004

(65) Prior Publication Data

US 2006/0055440 A1    Mar. 16, 2006

(51) Int. Cl.
*H03L 7/06* (2006.01)
(52) U.S. Cl. ...................... 327/156; 327/158
(58) Field of Classification Search ............. 327/147, 327/149, 153, 156, 158, 161, 162, 163; 365/233; 331/17, 25; 375/373, 375, 376
See application file for complete search history.

(56) References Cited

U.S. PATENT DOCUMENTS 5,838,179 A * 11/1998 Schmidt ............... 327/156
6,069,507 A    5/2000 Shen et al. ............ 227/156
6,842,399 B1 * 1/2005 Harrison ............... 365/233

* cited by examiner

*Primary Examiner*—Linh My Nguyen
(74) *Attorney, Agent, or Firm*—Winston Hsu

(57) ABSTRACT

A delay lock loop circuit for delaying a reference clock to lock a delayed clock. The delay lock loop circuit includes a clock divider for dividing a frequency of the reference clock by N to generate a frequency-divided clock, a programmable delay circuit electrically coupled to the clock divider for delaying the frequency-divided clock to generate the delayed clock, a 180° phase detector electrically coupled to the programmable delay circuit for detecting a phase change of the delayed clock, and a delay lock loop controller electrically coupled to the programmable delay circuit and the 180° phase detector for programming the programmable delay circuit to lock the delayed clock according to the phase change.

14 Claims, 3 Drawing Sheets

JITTER-RESISTIVE DELAY LOCK LOOP CIRCUIT FOR LOCKING DELAYED CLOCK AND METHOD THEREOF

BACKGROUND OF INVENTION

1. Field of the Invention

The invention relates to a delay lock loop (DLL) circuit and related method, and more particularly, to a jitter-resistive digital DLL circuit and related method for delaying a reference clock to lock a delayed clock through detecting one phase change.

2. Description of the Prior Art

Delay lock loop (DLL) circuitry is commonly utilized in computer processing environments for generating a required clock. While the clock rate of computers continually is increasing, low-skew clock distributions are becoming more important to achieve design speed objectives. Related art computer systems include processors that exchange data with a variety of memory devices and input/output peripheral devices. An exemplary memory device is a synchronous dynamic random access memory (SDRAM) employing a pipelined data to be transferred to the processor at a data transfer rate which is comparable to the processor's operating frequency. In a DDR memory application, data are outputted from a DDR SDRAM to a memory controller at both rising and falling edges of a clock cycle. However, the DLL implemented in the memory controller is designed to generate a delayed clock according to a memory clock for delaying the timing of latching the data which is inputted to the memory controller. That is, the DLL provides an amount of delay that appropriately shifts the original rising and falling edges of the memory clock. As a result, the memory controller is capable of storing correct data into the latched device.

FIG. 1 is a block diagram of a digital DLL 10 according to the related art. The DLL 10 includes a delay line 12 having a plurality of serially connected delay cells 13, a 360° phase detector 14, and a DLL controller 16. Each of the delay cell 13 is used to provide an amount of delay dt. Therefore, if the number of delay cells 13 in the delay line 12 is K, the total amount of the delay time on the input clock $CLK_i$ is equal to K*dt. A delayed clock $CLK_d$ and the input clock $CLK_i$ are delivered to the 360° phase detector 14. The related art 360° phase detector 14 outputs a notification signal Sc to the DLL controller 16 when detecting a 180° phase difference (i.e. the phase change) between the delayed clock $CLK_d$ and the input clock $CLK_i$ twice. That is, the notification signal $S_c$ informs the DLL controller 16 of the situation that the delayed clock $CLK_d$ is 360° lagging behind the input clock $CLK_i$. Therefore the DLL controller 16 continuously programs the amount of delay dt of each delay cell 13 to increase the total amount of delay on the input clock $CLK_i$ until the notification signal $S_c$ is generated from the 360° phase detector 14. The operation of the DLL 10 is further detailed as follows.

FIG. 2 is a simplified timing diagram illustrating the operation of the DLL 10 shown in FIG. 1. As mentioned above, the delay line 12 provides the input clock $CLK_i$ with a programmable amount of delay, and then outputs the delayed clock $CLK_d$. At $t_1$, the rising edge of the input clock $CLK_i$ is inputted into the delay line 12. With a proper control commanded by the DLL controller 16, the delay line 12 provides an amount of delay $dT_1$ to the input clock $CLK_i$. Therefore, the rising edge of the delayed clock $CLK_d$ is outputted from the delay line 12 at $t_2$. Because the notification signal $S_c$ is not generated from the 360° phase detector 14 yet, the DLL controller 16 controls the delay line 12 to gradually increase the amount of delay imposed upon the input clock $CLK_i$. As shown in FIG. 2, an amount of delay $dT_2$ ($dT_2>dT_1$) between $t_3$ and $t_4$, an amount of delay $dT_3$ ($dT_3>dT_2$) between $t_5$ and $t_6$, and an amount of delay $dT_4$ ($dT_4>dT_3$) between $t_7$ and $t_8$ are generated, respectively. Please note that if the 360° phase detector 14 is triggered by rising edges of the input clock $CLK_i$, the logic values detected by the 360° phase detector 14 at $t_1$, $t_3$, $t_5$, $t_7$, and $t_9$ are "0", "0", "0", "0", and "1". Therefore the 360° phase detector 14 judges that one 180° phase difference between the delayed clock $CLK_d$ and the input clock $CLK_i$ occurs at $t_9$.

Because the notification signal $S_c$ is not generated from the 360° phase detector 14 yet, the DLL controller 16, as mentioned above, keeps commanding the delay line 12 to gradually increase the amount of delay imposed upon the input clock $CLK_i$. As shown in FIG. 2, an amount of delay $dT_5$ ($dT_5>dT_4$) between $t_9$ and $t_{10}$, an amount of delay $dT_6$ ($dT_6>dT_5$) between $t_{11}$ and $t_{12}$, an amount of delay $dT_7$ ($dT_7>dT_6$) between $t_{13}$ and $t_{14}$ are generated, and an amount of delay $dT_9$ ($dT_6>dT_7$) between $t_{15}$ and $t_{16}$ are generated, respectively. As one can see, the logic values detected by the 360° phase detector 14 at $t_{11}$, $t_{13}$, $t_{15}$, and $t_{16}$ are "1", "1", "1", and "0". Therefore the 360° phase detector 14 judges that another 180° phase difference between the delayed clock $CLK_d$ and the input clock $CLK_i$ occurs at $t_{16}$. Because detecting the 180° phase difference between the delayed clock $CLK_d$ and the input clock $CLK_i$ twice, the 360° phase detector 14 triggers the notification signal $S_c$ to inform the DLL controller 16. Assume that the number of delay cells 13 in the delay line 12 is K, and one period of the input clock CLKi is T. Therefore, the setting for the delay line 12 delaying the input clock CLKi by the amount of delay $dT_8$, which is equal to T, is capable of forcing each delay cell 13 to has an amount of delay equaling $$\frac{T}{K}.$$

In other words, after the DLL 10 has successfully lock the delayed clock $CLK_d$ 360° lagging behind the input clock CLKi, an output of an $N^{th}$ delay cell within the delay line 12 corresponds to an amount of delay equal to $$N * \frac{T}{K}.$$

However, the DLL 10 shown in FIG. 1 does little to resist the effects of jitter. Jitter, a term familiar to those skilled in the art, refers to any deviation of amplitude, phase timing, or the width of signal pulse. Alternatively, jitter is defined as "the period frequency displacement of the signal from its ideal location". Jitter is typically caused by electromagnetic interference and cross talk with other signals. The effect of jitter on the DLL 10 results in erroneous delayed clocks, thereby making the DLL 10 malfunction to lock a wrong phase difference. Referring to FIG. 2, the effects of jitter on the DLL 10 advance the timing of a falling edge ideally occurring at $t_{11}$. Therefore, jitter causes the 360° phase detector 14 to detect a 180° phase difference at t' and erroneously triggers the notification signal Sc. As a result, each delay cell 13 does not provide a wanted amount of delay equaling $$\frac{T}{K}.$$

Therefore, an application device is unable to function normally due to an improper delayed clock generated from the delay line 12 of the related art DLL 10.

SUMMARY OF INVENTION

One objective of the present invention is therefore to provide a delay lock loop and related method capable of generating a delayed clock resistive to the effects of jitter, to solve the above-mentioned problem.

According to an exemplary embodiment of the present invention, a delay lock loop circuit for delaying a reference clock to lock a delayed clock is disclosed. The delay lock loop circuit includes a clock divider, a programmable delay circuit, a 180° phase detector, and a delay lock loop controller. The clock divider is for dividing a frequency of the reference clock by N to generate a frequency-divided clock. The programmable delay circuit is electrically coupled to the clock divider and for delaying the frequency-divided clock to generate the delayed clock. The 180° phase detector is electrically coupled to the programmable delay circuit and for detecting a phase change of the delayed clock from the reference clock or the frequency-divided clock. The delay lock loop controller which is electrically coupled to the programmable delay circuit and the 180° phase detector programs the programmable delay circuit to lock the delayed clock according to the phase change.

According to another exemplary embodiment of the present invention, a delay lock loop circuit for delaying a reference clock to lock a frequency-divided clock is disclosed. The delay lock loop circuit includes a programmable delay circuit, a clock divider, a 180° phase detector, and a delay lock loop controller. The programmable delay circuit is for delaying the reference clock to generate a delayed clock. The clock divider is electrically coupled to the programmable delay circuit and for dividing a frequency of the delayed clock by N to generate a frequency-divided clock. The 180° phase detector is electrically coupled to the clock divider and for detecting a phase change of the frequency-divided clock from the reference clock. The delay lock loop controller, which is electrically coupled to the programmable delay circuit and the 180° phase detector, programs the programmable delay circuit to lock the frequency-divided clock according to the phase change.

It is one advantage of this invention that the present invention DLL is capable of resisting the jitter. This solution is the combined effects of a clock divider and a 180° phase detector. The clock divider makes a frequency-divided clock have a longer clock cycle and lower frequency, which tends to alleviate the effects of jitter. The 180° phase detector further reduces the effects of jitter by detecting the 180° phase difference once. This means, that if the serious jitter occurs after one 180° phase difference detected, the jitter shifting a next rising or falling edge does not interfere with the operation of the DLL.

These and other objectives of the present invention will no doubt become obvious to those of ordinary skill in the art after reading the following detailed description of the preferred embodiment that is illustrated in the various figures and drawings.

DETAILED DESCRIPTION OF THE INVENTION

Figure 3:
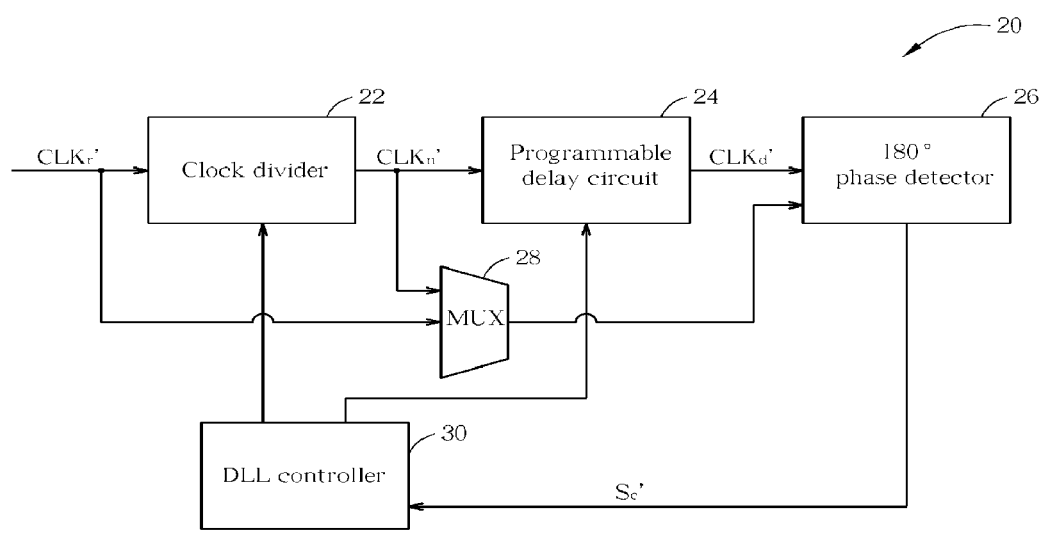
FIG. 3 is a block diagram of a digital delay lock loop according to a first embodiment of the present invention.

FIG. 3 is a block diagram of a digital DLL 20 according to a first embodiment of the present invention. The DLL 20 comprises a clock divider 22, a programmable delay circuit 24, a 180° phase detector 26, a multiplexer (MUX) 26 and a DLL controller 30. In the configuration shown in FIG. 3, the DLL 20 is capable of resisting the effects of jitter. A reference clock $CLK_r'$ is inputted into the clock divider 20, which divides the frequency of the reference clock $CLK_r'$ by a frequency-dividing value D and generates a frequency-divided clock $CLK_n'$. The frequency-dividing value D can be specified by the user in the DLL controller 30 and is passed to the clock divider 20. That is, the frequency-dividing value D is programmable and dictated by the intended application of the DLL 20. The division of the frequency of $CLK_r'$ is partially responsible for resisting the effects of jitter; this will be described in greater depth later.

Generally speaking, the division of frequency is made possible using a counter, a multiplexer and a D-type flip-flop. The reference clock $CLK_r'$ is inputted into a clock-in node of the D-type flip-flop for triggering the D-type flip-flop to latch the logic value at a data-in node of the D-type flip-flop. The counter counts clock cycles of the reference clock $CLK_r'$. In addition, the counter value is then compared with a threshold value (e.g. the frequency-dividing value D). Before the counter value is equal to the threshold value, the logic value at a non-inverted data-out node of the D-type flip-flop is fed back into a data-in node of the D-type flip-flop through the selection made by the multiplexer. However, if the counter value is equal to the threshold value, the multiplexer receives a selection signal triggered by the counter for allowing the logic value at an inverted data-out node of the D-type flip-flop to be fed into the data-in node before the selection signal is reset. At this time, the latched logic value at the non-inverted data-out node has a level transition. In other words, a signal outputted from the non-inverted data-out node is triggered once each time the counter value is equal to the threshold value, thereby generating the wanted frequency-divided clock $CLK_n'$. Because process of frequency division is known to anyone skilled in the art, further discussion is omitted for the sake of brevity.

Figure 1:
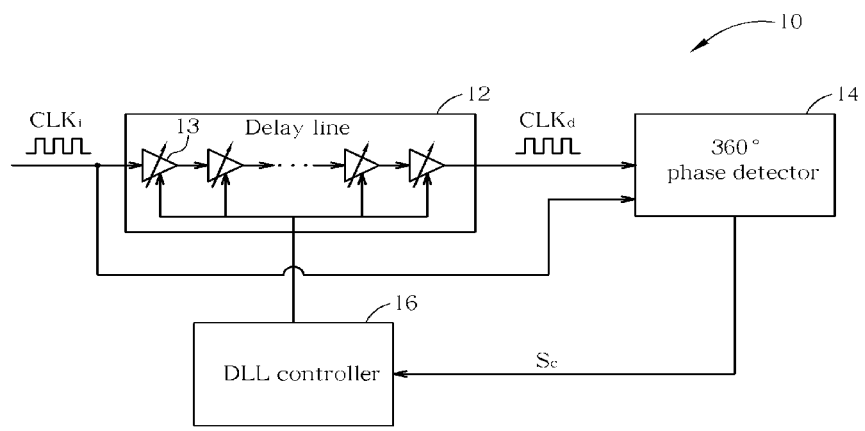
FIG. 1 is a block diagram of a digital delay lock loop according to the related art.
Figure 2:
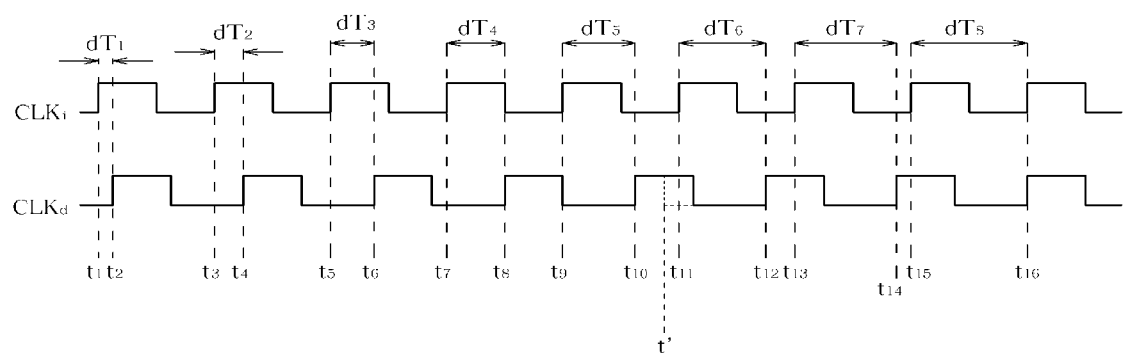
FIG. 2 is a simplified timing diagram illustrating the operation of the delay lock loop shown in FIG. 1.

The frequency-divided clock $CLK_n'$ is then used as the input into the programmable delay circuit 24. The programmable delay circuit 24 is used to delay the incoming frequency-divided clock $CLK_n'$ by an amount of delay controlled by the DLL Controller 28. Please note that any type of an adjustable delay circuit can be used, and such implementation is well known to those skilled in the art; for instance, the related art delay line 12 shown in FIG. 1 is utilized. Therefore, description as to how the delay is accomplished is omitted. The programmable delay circuit 24 delays the frequency-divided clock $CLK_n'$ to form a delayed clock $CLK_d'$.

Figure 4:
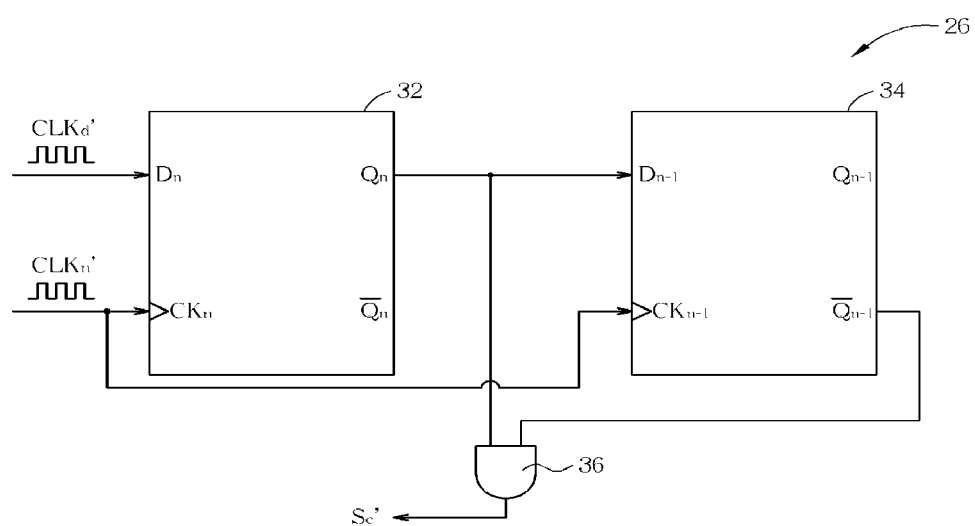
FIG. 4 is a circuit diagram of a 180° phase detector shown in FIG. 3.

The delayed clock $CLK_d'$ is then inputted into the 180° phase detector 26. In this embodiment, the multiplexer 28 is controlled to select either the reference clock $CLK_r'$ or the frequency-divided clock $CLK_n'$ inputted into the 180° phase detector 26. Assume that the multiplexer 28 is controlled to transmit the frequency-divided clock $CLK_n'$ to the 180° phase detector 26. The 180° phase detector 26 triggers a notification signal Sc when detecting that the phase of the delayed clock $CLK_d'$ is 180° lagging behind that of the frequency-divided clock $CLK_n'$. FIG. 4 is a circuit diagram of the 180° phase detector 26 shown in FIG. 3. As shown in FIG. 4, the 180° phase detector 26 comprises two D-type flip-flops 32, 34 and an AND gate 36. The D-type flip-flops 32, 34 are triggered by rising edges of the same frequency-divided clock $CLK_n'$. The D-type flip-flop 34 stores the logic value previously latched by the D-type flip-flop 32 at node $Q_n$. It is obvious that the notification signal $S_c$ has a level transition from "0" to "1" only when both the logic values latched at nodes $Q_n$ and $\overline{Q}_{n-1}$ correspond to "1". In other words, when two logic values sequentially latched at node $Q_n$ are "0" and "1", the AND gate 36 forces the logic level of the notification signal Sc to be "1". Then the notification signal Sc is triggered due to the level transition.

Figure 5:
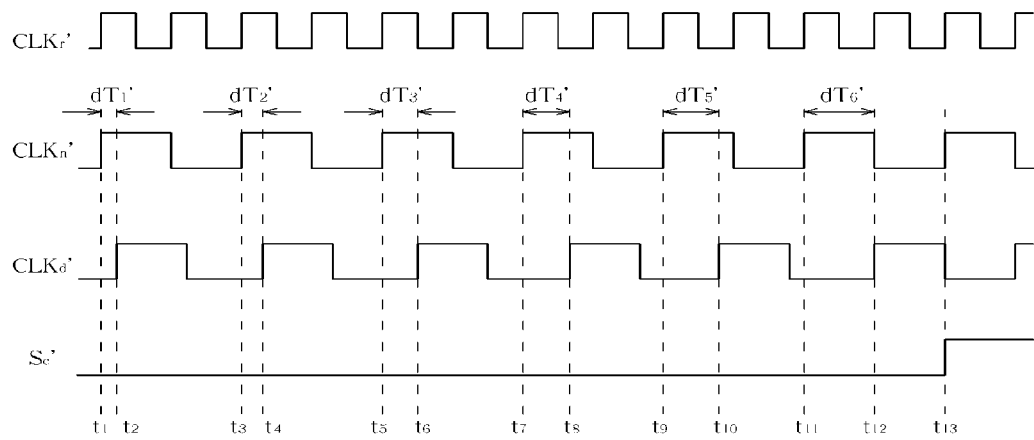
FIG. 5 is a simplified timing diagram illustrating the operation of the phase lock loop shown in FIG. 3.

Please refer to FIG. 5 in conjunction with FIGS. 3 and 4. FIG. 5 is a simplified timing diagram illustrating the operation of the DLL 20 shown in FIG. 3. In this embodiment, assume that the frequency-dividing value D set to the clock divider 22 is equal to two. As shown in FIG. 5, one period of the frequency-divided clock $CLK_n'$ doubles that of the reference clock $CLK_r'$. With a proper control given by the DLL controller 30, the programmable delay circuit 24 provides an amount of delay $dT_1'$ to the frequency-divided clock $CLK_n'$. Therefore, the rising edge of the delayed clock $CLK_d'$ is outputted from the programmable delay circuit 24 at $t_2$. Because the notification signal Sc' is not triggered by the AND gate 36 yet, the DLL controller 30 controls the programmable delay circuit 24 to gradually increase the amount of delay imposed upon the frequency-divided clock $CLK_n'$. As shown in FIG. 5, an amount of delay $dT_2'$ ($dT_2'>dT_1'$) between $t_3$ and $t_4$, an amount of delay $dT_3'$ ($dT_3'>dT_2'$) between $t_5$ and $t_6$, an amount of delay $dT_4'$ ($dT_4'>dT_3'$) between $t_7$ and $t_8$, an amount of delay $dT_5'$ ($dT_5'>dT_4'$) between $t_9$ and $t_{10}$, an amount of delay $dT_6'$ ($dT_6'>dT_5'$) between $t_{11}$ and $t_{12}$ are generated, respectively. As mentioned before, the D-type flip-flops 32, 34 in the 180° phase detector 26 are triggered by rising edges of the frequency-divided clock $CLK_n'$. Therefore, the logic values latched by node $Q_n$ at $t_1, t_3, t_5, t_7, t_9, t_{11}$ and $t_{13}$ are "0", "0", "0", "0", "0", "0" and "1".

At $t_{11}$, node $Q_n$ latches the logic value "0", and node $Q_{n-1}$ latches the logic value "0" previously latched by the node $Q_n$ at $t_9$. However, at $t_{13}$, node $Q_n$ latches the logic value "1", and node $Q_{n-1}$ latches the logic value "0" previously latched by node $Q_n$. Then, an inverted node $\overline{Q}_{n-1}$ latches the logic value "1". So the AND gate 36 outputs the logic value "1" because of two inputted logic values "1". The output of the AND gate 36 makes the notification signal Sc' have a level transition from "0" to "1". Therefore the 180° phase detector 26 judges that one 180° phase difference between the delayed clock $CLK_d'$ and the frequency-divided clock $CLK_n'$ occurs at $t_{13}$. The 180° phase detector can be implemented by a digital circuit or an analog circuit. And the level transition from "1" to "0" can also use to detect 180° in the case that the circuit is triggered by a negative clock edge.

In this embodiment, the frequency-dividing value D is equal to two. Assume that the number of delay cells (not shown) in the programmable delay circuit 26 is M, and one period of the reference clock $CLK_r'$ is T. Therefore, the setting for the programmable delay circuit 24 delaying the frequency-divided clock $CLK_r'$ by the amount of delay $dT_6'$ is capable of forcing each delay cell to has an amount of delay equaling $$\frac{D*T}{M}, \text{ i.e. } \frac{2*T}{M}.$$

In other words, after the DLL 20 has successfully locked the delayed clock $CLK_d'$ 180° lagging behind the frequency-divided clock $CLK_n'$, an output of an Nth delay cell within the programmable delay circuit 24 is sure to produce an amount of delay equaling $$N*\frac{2*T}{M}.$$

Please note that the above-mentioned frequency-dividing value D set to two is only meant to serve as an example, and is not meant to be taken as a limitation.

If the DLL 20 is required to make each delay cell have a desired amount of delay equal to $$\frac{T}{N},$$

the number of delay cells M and the frequency-dividing value D need to be properly designed according to the following equation.

$$\frac{T}{N} = \frac{D*T}{2*M} \qquad \text{Equation (1)}$$

Therefore, based on Equation (1), the frequency-dividing value D is determined as follows.

$$D = \frac{2*M}{N} \qquad \text{Equation (2)}$$

As mentioned before, the frequency-divided clock $CLK_n'$ entering the 180° phase detector 26 comes from the multiplexer 28 shown in FIG. 3. However, it is allowable for the 180° phase detector 26 to utilize the reference clock $CLK_r'$ instead of the frequency-divided clock $CLK_n'$. Concerning this scheme, the 180° phase detector 26 is triggered once every two clock cycles of the reference clock $CLK_r'$ if the frequency-dividing value D is set to two. In addition, those skilled in the art will readily observe from this description that the 180° phase detector 26 can easily be configured to detect falling edges of the delayed clock. How these modifications accomplished is considered obvious to those skilled in the art, so further description is omitted. The end-result of doing these is the same. Therefore, the same objective of locking a 180° phase difference is successfully achieved.

Please note that, in this embodiment, after the DLL controller 30 acknowledges the trigger carried by the notification signal Sc', the 180° phase detector 26 is reset for a next delay-locking operation. In addition, the DLL controller 30 can be easily implemented by a state machine to control the overall delay-locking operation. Because the DLL controller is well-known to anyone skilled in the art, further discussion is omitted for brevity.

Figure 6:
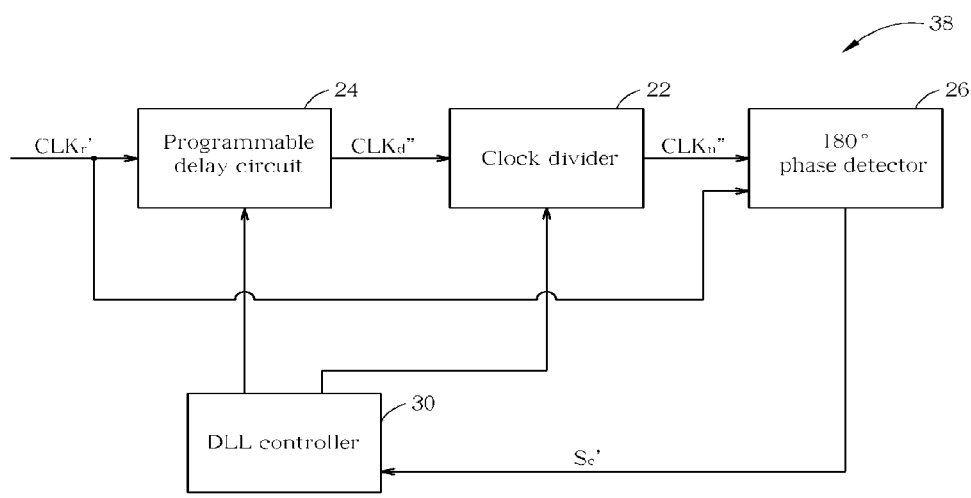
FIG. 6 is a block diagram of a digital phase lock loop according to a second embodiment of the present invention.

A second embodiment of the DLL 38 according to the present invention is shown in FIG. 6. The enumeration of the parts has been maintained as in FIG. 3. In this embodiment the positions of the clock divider 20 and the programmable delay circuit 22 are swapped, so that the reference clock $CLK_r'$ is inputted into the programmable delay circuit 22. In this configuration, only the reference clock $CLK_r'$ can be used as the trigger for the 180° phase detector 26, as such the multiplexer 28 is not included. Because the operation of this second embodiment is so similar to that of the first embodiment, further description of it is omitted for the sake of brevity.

All the presented embodiments of the present invention DLL resist the effect of jitter. This solution is the combined effects of the clock divider 22 and the configuration of the 180° phase detector 26. The clock divider 20 makes the frequency-divided clock $CLK_n'/CLK_n''$ have a longer clock cycle, which tends to alleviate the effects of jitter, i.e., the frequency-divided clock $CLK_n'/CLK_n''$ is more resistive to jitter than the high-frequency reference clock $CLK_r'$. The 180° phase detector 26 further reduces the effects of jitter by detecting the 180° phase difference once. This means, that if the serious jitter occurs after one 180° phase difference detected, the jitter shifting a next rising or falling edge does not interfere with the operation of the DLL 20 or the DLL 38.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A delay lock loop circuit for delaying a reference clock to lock a delayed clock, the delay lock loop circuit comprising:
   a clock divider for dividing a frequency of the reference clock by N to generate a frequency-divided clock;
   a programmable delay circuit electrically coupled to the clock divider, the programmable delay circuit for delaying the frequency-divided clock to generate the delayed clock;
   a 180° phase detector electrically coupled to the programmable delay circuit, the 180° phase detector for detecting a phase change of the delayed clock;
   a multiplexer electrically coupled to the clock divider and the reference clock for sending either the reference clock or the frequency-divided clock as a driving clock to the 180° phase detector; and
   a delay lock loop controller electrically coupled to the programmable delay circuit and the 180° phase detector, the delay lock loop controller for programming the programmable delay circuit to lock the delayed clock according to the phase change.

2. The delay lock loop circuit of claim 1 wherein if the driving clock is the reference clock, the 180° phase detector is triggered once every N cycles of the reference clock, and if the driving clock is the frequency-divided clock, the 180° phase detector is triggered once each cycle of the frequency-divided clock.

3. The delay lock loop circuit of claim 1 wherein the driving clock of the 180° phase detector is the frequency-divided clock.

4. The delay lock loop circuit of claim 3 wherein the 180° phase detector is triggered once each cycle of the frequency-divided clock.

5. The delay lock loop circuit of claim 1 wherein the driving clock of the 180° phase detector is the reference clock.

6. The delay lock loop circuit of claim 5 wherein the 180° phase detector is triggered once every N cycles of the reference clock.

7. A method for delaying a reference clock to lock a delayed clock, the method comprising:
   dividing a frequency of a reference clock by N to generate a frequency-divided clock;
   delaying the frequency-divided clock by an amount of delay to generate the delayed clock;
   providing a 180° phase detector, and utilizing the 180° phase detector for detecting a phase change of the delayed clock; and
   selecting the reference clock or the frequency-divided clock to be a driving clock of the 180° phase detector, programming the amount of delay for locking the delayed clock according to the phase change.

8. The method of claim 7 wherein if the driving clock is the reference clock, the 180° phase detector is triggered once every N cycles of the reference clock, and if the driving clock is the frequency-divided clock, the 180° phase detector is triggered once each cycle of the frequency-divided clock.

9. The method of claim 7 wherein a driving clock of the 180° phase detector is the frequency-divided clock.

10. The method of claim 9 wherein the 180° phase detector is triggered once each cycle of the frequency-divided clock.

11. The method of claim 7 wherein a driving clock of the 180° phase detector is the reference clock.

12. The method of claim 11 wherein the 180° phase detector is triggered once every N cycles of the reference clock.

13. A delay lock loop circuit comprising:
   a clock divider and programmable delay circuit for dividing a frequency of a reference clock by N and delaying the frequency to thereby generate a delayed and frequency-divided clock;
   a 180° phase detector electrically coupled to the clock divider and programmable delay circuit, the 180° phase detector for detecting a phase change of the delayed and frequency-divided clock; and
   a delay lock loop controller electrically coupled to the clock divider and programmable delay circuit, and the 180° phase detector; the delay lock loop controller for programming the clock divider and programmable delay circuit to lock the delayed and frequency-divided clock according to the phase change.

14. A method for delaying a reference clock, the method comprising:
   dividing a frequency of a reference clock by N and delaying the frequency by an amount of delay to thereby generate a delayed and frequency-divided clock;
   providing a 180° phase detector, and utilizing the 180° phase detector for detecting a phase change of the delayed and frequency-divided clock; and
   programming division of the reference clock and amount of delay for locking the delayed and frequency-divided clock according to the phase change.

* * * * *